United States Patent [19]
Takano

[11] Patent Number: 5,960,309
[45] Date of Patent: Sep. 28, 1999

[54] SEMICONDUCTOR INTEGRATED CIRCUIT AND WIRING METHOD

[75] Inventor: Midori Takano, Kokubunji, Japan

[73] Assignee: Kabushiki Kaisha Toshiba, Kawasaki, Japan

[21] Appl. No.: 08/690,623

[22] Filed: Jul. 31, 1996

[30] Foreign Application Priority Data

Jul. 31, 1995 [JP] Japan .................................. 7-194749

[51] Int. Cl.$^6$ .................................................. H01L 21/44
[52] U.S. Cl. .......................................... 438/622; 438/637
[58] Field of Search .................................. 438/622, 637, 438/666, 668

[56] References Cited

U.S. PATENT DOCUMENTS 4,638,458  1/1987  Itoh .
5,119,170  6/1992  Iwamatsu .
5,631,478  5/1997  Okumura .
5,883,433  3/1999  Oda ........................................ 257/750

*Primary Examiner*—Caridad Everhart
*Attorney, Agent, or Firm*—Foley & Lardner

[57] ABSTRACT

A method wires devices formed on a semiconductor integrated circuit. The method includes the steps of finding a wiring path between the devices, determining whether or not a delay in transmitting signals through the wiring path is within a predetermined range, and if the delay is out of the constraint, changing the number, or area, or both of them of through-holes of a given via in the wiring path so that the delay meets in the timing constraints. The integrated circuit thus wired is capable of handling signals that require severe delay specifications.

14 Claims, 8 Drawing Sheets

SEMICONDUCTOR INTEGRATED CIRCUIT AND WIRING METHOD

BACKGROUND OF THE INVENTION

1. Field of the Invention

The present invention relates to a method of wiring logic devices of a semiconductor integrated circuit, to provide a required operation, and particularly, to a method of wiring a semiconductor integrated circuit, capable of properly adjusting a delay in transmitting signals in the circuit.

2. Description of the Prior Art

A semiconductor integrated circuit has logic devices formed on a semiconductor substrate. The logic devices are wired with metal thin films, to provide a required operation. The wiring has resistance and capacitance that cause a delay in transmitting signals. This may disturb the timing of each signal, thereby causing trouble in the operation of the circuit.

Signals in an integrated circuit are classified into data bus signals and clock signals. The data bus signals are restricted by setup and hold time, and when transferred between registers, they must keep upper and lower limits on a delay, or they will not be transferred in time.

The clock signals must keep an upper limit for a skew, or devices such as flip-flops that are required to operate simultaneously will operate out of pace, to incorrectly transmit data. The clock signals must also keep upper and lower limits on a delay in a chip, or the chip in question will cause a skew with respect to another chip, thereby malfunctioning a system that contains the chips.

To minimize delay and skew due to the resistance and capacitance of wiring, several techniques such as Japanese Unexamined Patent Publications 4-0269860, 5-54100, and 6114951 have been proposed.

Recent semiconductor integrated circuits employ very fine wiring with small vias whose resistance causes a delay in transmitting signals.

The via is the interconnection between two layers having through-holes and rectangle pattern of the connection layers.

A fine via has a very small through-hole, which is very difficult to fill with conventional wiring material such as aluminum. In this case, the through-hole is filled with a different wiring material, which may increase the resistance of the via to a level which cannot be ignored.

A latest processing technique forms a gate length of 0.5 micrometers or shorter for a transistor. If tungsten (W) is used to fill a through-hole of a via formed according to such fine processing technique, the resistance of the through-hole becomes several ohms.

It is important to minimize delay and skew caused by the resistance of vias.

To reduce the resistance of a via, Japanese Unexamined Patent Publication 2-140952 discloses a technique to adjust the number of through-holes formed in a via, thereby providing a required current value. This technique, however, does not consider a delay caused by the resistance of the via itself when adjusting the number of through-holes.

The prior art deals only with a delay caused by the resistance and capacitance of wiring and provides no effective measures to deal with a delay caused by the resistance of vias.

There is no prior art that minimizes delay and skew caused by the resistance of vias and solves the problem in the recent fine wiring process.

SUMMARY OF THE INVENTION

An object of the present invention is to provide a method of adjusting a delay caused by the resistance of vias of wiring formed on a semiconductor integrated circuit, so that the circuit may handle signals that require strict delay specifications. The via is the interconnection between two layers having through-holes and rectangle pattern of the connection layers.

In order to accomplish the object, the present invention provides a method of wiring devices formed on a semiconductor integrated circuit, including the steps of finding a wiring path between the devices, determining whether or not a delay in transmitting signals through the wiring path is within a predetermined constraint, and if the delay is out of the constraint, changing the number, or area, or both of them of through-holes of a given via in the wiring path so that the delay meets the timing constraints.

The constraint is defined as upper and lower limits;

Consequently, the method optimizes a delay in transmitting signals through the wiring path.

Changing the number, or area, or both of them of through-holes of a given via is achieved by providing the via with a plurality of through-holes of standard size, or a single through-hole of large size, or a plurality of through-holes of large size.

The via whose through-hole is changed is preferably one nearest to a terminal of the device that sends signals to the wiring path.

When a wiring path whose delay time is going to be optimized has no via, it is preferable to form at least one via in the path and determine the number, or area, or both of them of through-holes to be formed in the via.

The present invention also provides a method of forming a connection path between the delay balance points of two wiring paths of a semiconductor integrated circuit. The method adjusts the number, or area, or both of them of vias of the wiring paths, to move the delay balance points, thereby shortening the connection path.

This method minimizes a delay in transmitting signals through the connection path.

The present invention also provides a method of wiring the terminals of devices formed on a semiconductor integrated circuit. The method prepares electrically equivalent terminals for the devices so that the terminals are ready to form a via having through-holes whose number and area are optionally determined according to a required transmission delay. The via thus formed is connected to a signal line.

This method is advantageous in reducing the resistance of a via as well as a transmission delay.

DETAILED DESCRIPTION OF THE EMBODIMENTS

Figure 1:
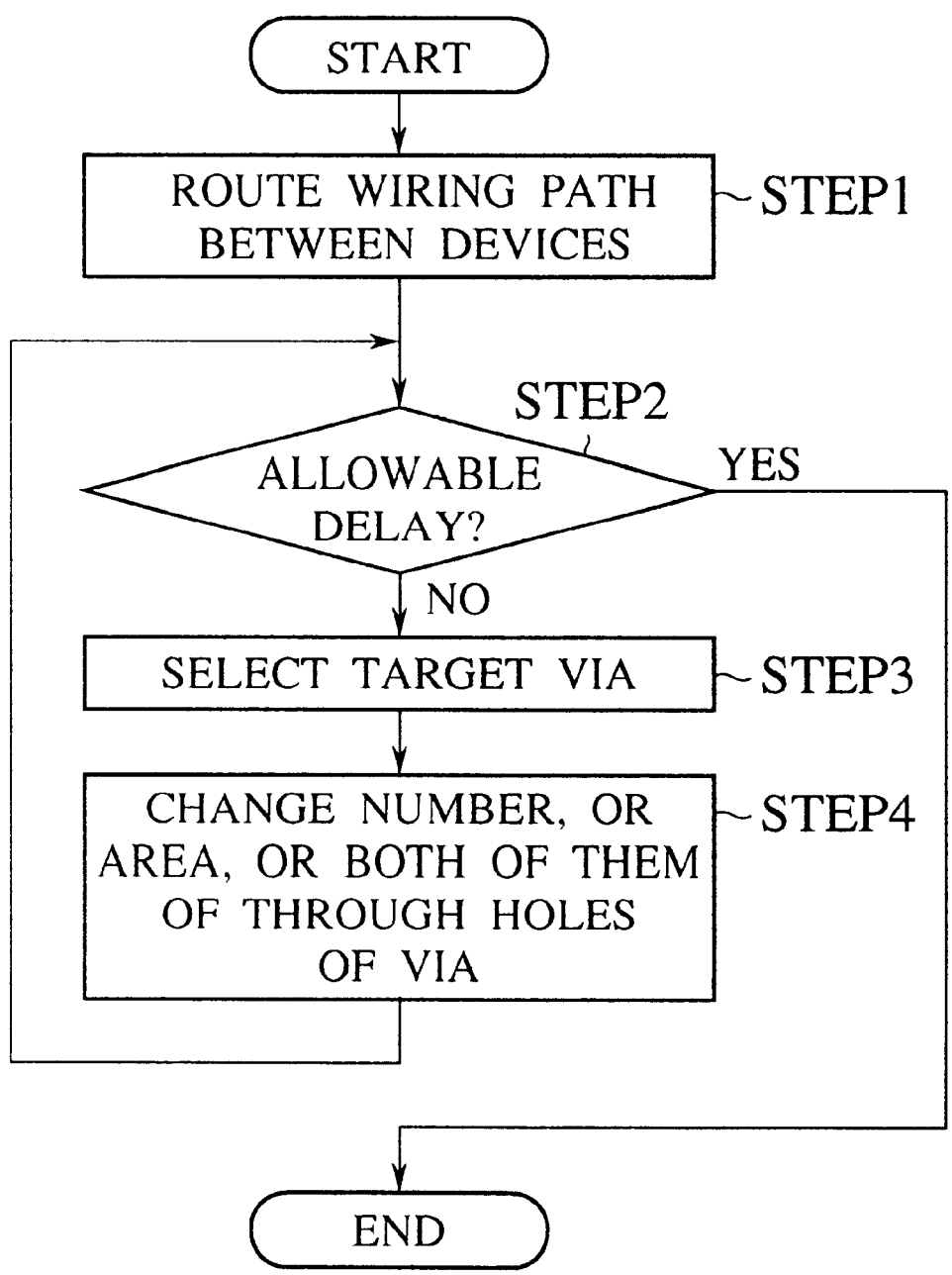
FIG. 1 is a flowchart showing the steps of wiring a semiconductor integrated circuit.

Various embodiments of the present invention will be described with reference to the accompanying drawings. FIG. 1 is a flowchart showing the steps of wiring a semiconductor integrated circuit. Before carrying out these steps, the position of each device of the circuit must be determined.

Step 1 routes each wiring path among the devices according to the positions thereof.

Step 2 calculates the delay in transmitting a signal through a given wiring path routed in step 1 and determines whether or not the delay is within a specified constraint. If the delay is within the specified constraint, the flow ends, and if not, the flow goes to step 3. The constraint is defined as upper and lower limits.

Step 3 selects a target via among vias in the wiring path. The target via may be one nearest to an output terminal of the device that provides a signal to the wiring path. The via is the interconnection between two layers having through-holes and a rectangle pattern of the connection layers.

Step 4 changes the area of a through-hole of the target via so that the delay meets in the specified timing constraints.

Step 2 again calculates the delay of the wiring path and determines whether or not the delay is within the specified constraint. If it is within the specified range, the flow ends, and if not, the following steps are repeated.

Techniques of changing the area of a through-hole of a via carried out in step 4 will be explained.

First, the principle of reducing the resistance of a via will be explained.

To reduce the resistance of a via, the area of a through-hole of the via must be increased. This may be achieved by increasing the area of the through-hole itself, or by increasing the number of through-holes of the via.

Figure 2:
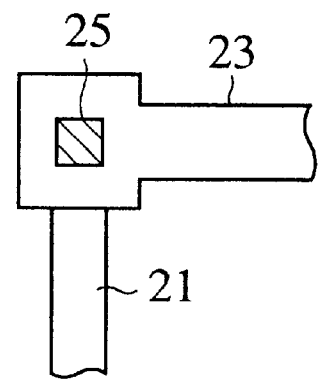
FIG. 2 shows a standard via having a through-hole.

FIG. 2 shows a via having a standard through-hole. A wire 21 formed on a first layer is connected to a wire 23 formed on a second layer through the through-hole 25. The via has a minimum area. If the through-hole 25 is filled with tungsten (W) to deal with transistors each having a gate length of 0.5 micrometers or shorter, the resistance of the via will be several ohms. In the following explanation, the via of FIG. 2 is supposed to have a resistance of one ohm.

Figure 3:
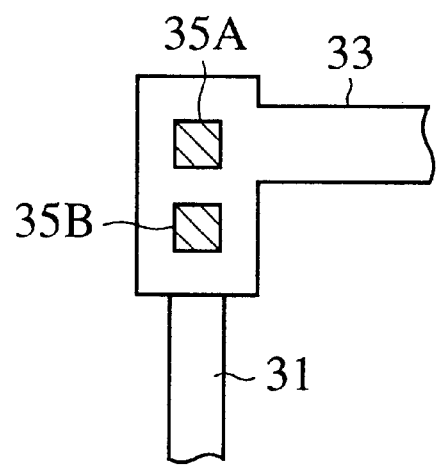
FIG. 3 shows a via having two through-holes according to an embodiment of the present invention.

FIG. 3 shows a via having two through-holes according to an embodiment of the present invention. A wire 31 formed on a first layer is connected to a wire 33 formed on a second layer through the through-holes 35A and 35B. Each of the through-holes 35A and 35B has the same area as the through-hole 25 of FIG. 2. Accordingly, the through-hole area of FIG. 3 is twice as large as that of FIG. 2, to halve the resistance of the via of FIG. 3 to 0.5 ohms.

Figure 4:
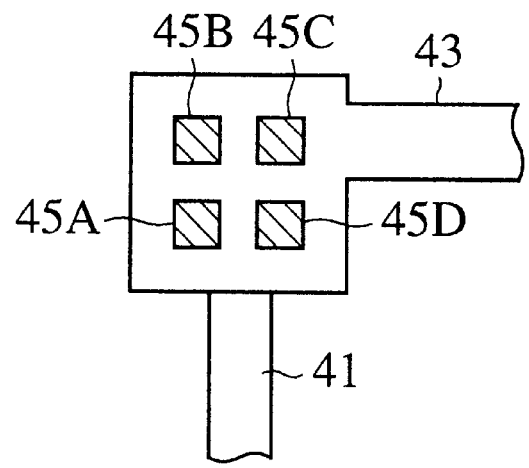
FIG. 4 shows a via having four through-holes according to an embodiment of the present invention.

FIG. 4 shows a via having four through-holes according to an embodiment of the present invention. A wire 41 formed on a first layer is connected to a wire 43 formed on a second layer through the through-holes 45A to 45D. Each of the through-holes 45A to 45D has the same area as the through-hole 25 of FIG. 2. Accordingly, the through-hole area of FIG. 4 is four times as large as that of FIG. 2, to reduce the resistance of the via of FIG. 4 to 0.25 ohms.

Figure 5:
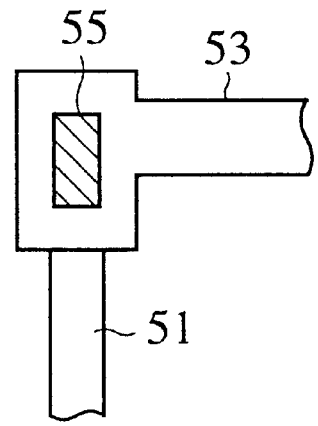
FIG. 5 shows a via having a large through-hole area according to an embodiment of the present invention.

FIG. 5 shows a via having a through-hole according to an embodiment of the present invention. A wire 51 formed on a first layer is connected to a wire 53 formed on a second layer through the through-hole 55. The area of the through-hole 55 is greater than that of the through-hole 25 of FIG. 2.

Generally, the resistance of a through-hole is in inverse proportion to the area thereof as follows:

$$R = \rho \times 1/S \quad (1)$$

where R is the resistance of the through-hole (via), ρ is the characteristic resistance of material, S is the area of the through-hole, and 1 is a constant.

Accordingly, the resistance of the via of FIG. 5 decreases as the area of the through-hole 55 increases.

Techniques of reducing a delay in transmitting signals through a wiring path by reducing the resistance of a via in the wiring path will be explained.

Figure 6:
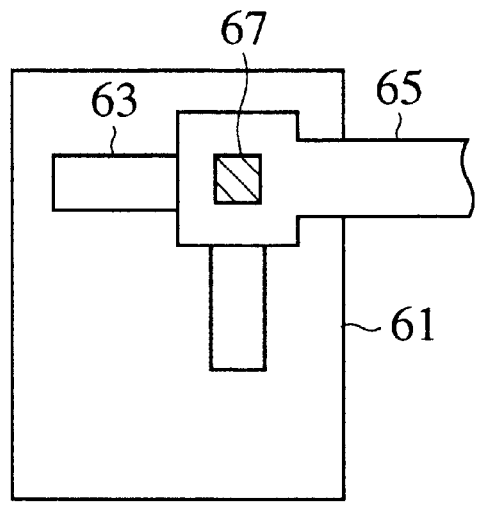
FIG. 6 shows a terminal of a device connected to a signal line through a via having a through-hole according to a prior art.

FIG. 6 shows terminal 63 of a device 61 connected to a signal line 65 through a via having a through-hole 67 according to a prior art. The resistance of the via is $r_{via}$ and total capacitance downstream from the via is C. Then, a delay D1 due to the resistance of the via is as follows:

$$D1 = r_{via} \times C \quad (2)$$

Figure 7:
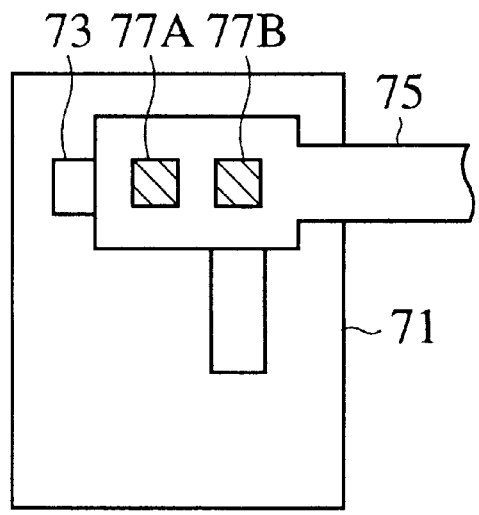
FIG. 7 shows a terminal of a device connected to a signal line through a via having two through-holes according to an embodiment of the present invention.

FIG. 7 shows a terminal 73 of a device 71 connected to a signal line 75 through a via having through-holes 77A and 77B according to an embodiment of the present invention. The area of each of the through-holes 77A and 77B is the same as that of the through-hole 67 of FIG. 6. The resistance of the via of FIG. 7 is half the resistance $r_{via}$ of FIG. 6 as explained with reference to FIG. 3, and therefore, a delay D2 due to the via of FIG. 7 is as follows:

$$D2 = (r_{via}/2) \times C \quad (3)$$

According to the expressions (2) and (3), the delay due to the via of FIG. 7 is half the delay due to the via of FIG. 6.

If each via is arranged in the vicinity of an output terminal having an ON resistance of $R_{on}$ and a total capacitance of C0, a delay D3 due to the resistance of the via of FIG. 6 and a delay D4 due to the resistance of the via of FIG. 7 are as follows:

$$D3 = (R_{on} + r_{via}) \times C0 \quad (4)$$

$$D4 = (R_{on} + r_{via}/2) \times C0 \quad (5)$$

According to these expressions, the via of FIG. 7 is advantageous in reducing the delay.

Figure 8A:
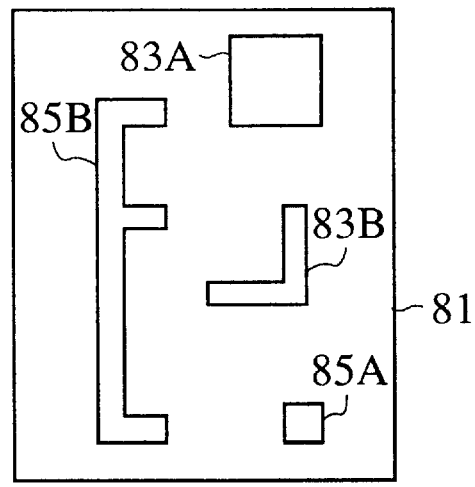
FIGS. 8A to 8C show connections between electrically equivalent terminals of a device and wires according to the present invention.
Figure 8B:
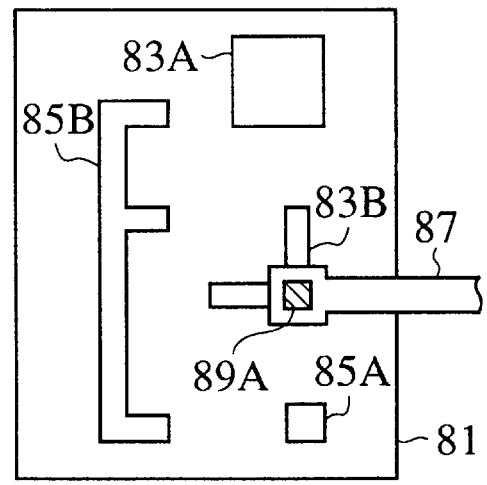
Figure 8C:
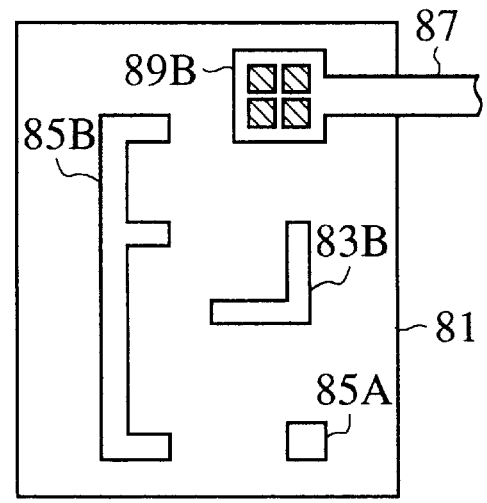

FIGS. 8A to 8C show a device 81 having electrically equivalent terminals 83A and 83B and other terminals 85A and 85B. The terminals 83A and 83B are ready to form vias having different areas, respectively.

In FIG. 8B, it is not required to reduce a delay caused by the resistance of a via. In this case, the terminal 83B is connected to a signal line 87 through a via having a usual through-hole 89A.

In FIG. 8C, it is required to reduce a delay caused by the resistance of a via. In this case, the terminal 83A is connected to the signal line 87 through a via having through-holes 89B each having the same area as the through-hole 89A of FIG. 8B.

In this way, the present invention provides a device with electrically equivalent terminals that are ready to form vias having through-holes of different areas, respectively, to optionally reduce a delay in transferring signals from the device to a wiring path. In FIG. 8C, the four through-holes may be replaced with at least one large through-hole.

Next, techniques of adding a delay to a wiring path with the use of the resistance of a via will be explained.

Figure 9A:
FIGS. 9A and 9B show vias formed in a wiring path, to add a delay according to an embodiment of the present invention.
Figure 9B:
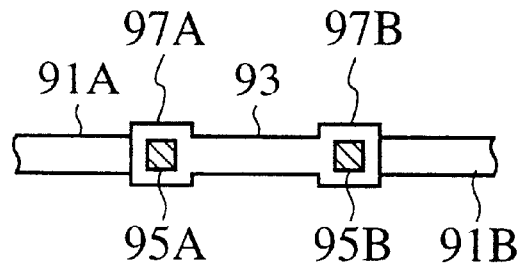

FIG. 9A shows a wiring path 91 without via, and FIG. 9B shows the same wiring path 91 connected to a wiring path 93, which is formed on a different layer, through vias 97A and 97B having through-holes 95A and 95B.

More precisely, wire segment 91A of the wiring path 91 is connected to the wiring path 93 through the through-hole 95A, and wire segment 91B of the wiring path 91 is connected to the wiring path 93 through the through-hole 95B.

A signal may be transferred from the wire segment 91A toward the wire segment 91B. The wire segment 91B has a capacitance of $C_{91B}$ and a resistance of $R_{91B}$, the wiring path 93 has a capacitance of $C_{93}$ and a resistance of $R_{93}$, the via 97A having the through-hole 95A has a resistance of $r_{97A}$, and the via 97B having the through-hole 95B has a resistance of $r_{97B}$. A delay D5 downstream from the via 97B and a delay D6 downstream from the via 95A are as follows:

$$D5 = (R_{91B}/2 + r_{97B}) \times C_{91B} \quad (6)$$

$$D6 = (R_{93}/2 + r_{97A}) \times C_{93} + (R_{93} + r_{97A}) \times C_{91B} + (R_{91B}/2 + r_{97B}) \times C_{91B} \quad (7)$$

A delay D7 of the wiring paths 93 and 91B without considering the resistance of the vias is as follows:

$$D7 = R_{93} \times (C_{93}/2 + C_{91B}) + R_{91B} \times C_{91B}/2 \quad (8)$$

According to the expressions (7) and (8), the resistance values $r_{97A}$ and $r_{97B}$ of the vias 97A and 97B increase the delay.

Figure 10A:
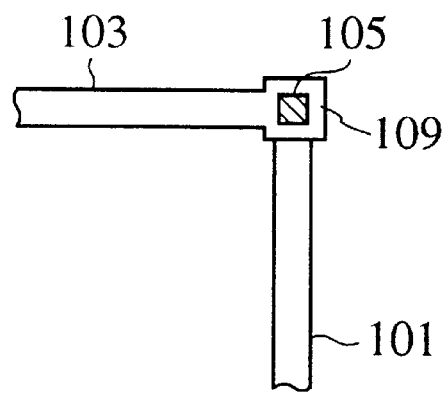
FIGS. 10A and 10B show vias formed in wiring paths, to add a delay according to an embodiment of the present invention.
Figure 10B:
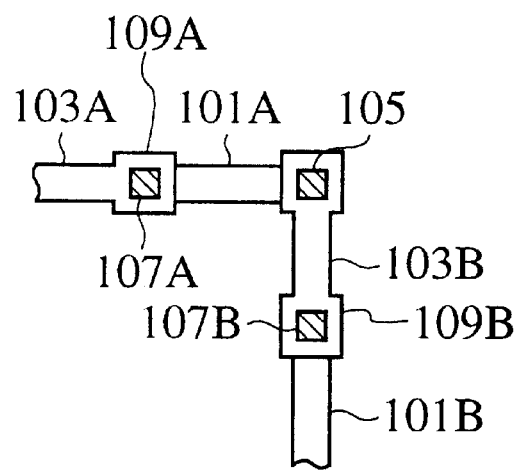

FIGS. 10A and 10B show vias formed in wiring paths, to add a delay according to an embodiment of the present invention, in which FIG. 10A is before forming the vias and FIG. 10B is after forming the vias.

In FIG. 10A, a wire segment 101 formed on a first layer is connected to a wire segment 103 formed on a second layer through a through-hole 105 of the via 109. In FIG. 10B, through-holes 107A and 107B of vias 109A and 109B are formed in the wires, to increase the resistance of the vias, thereby elongating a delay.

In this way, the present invention adds a delay to a wiring path with the use of the resistance of vias formed in the wiring path, without largely changing the structure of the wiring path. The present invention is applicable to balance delays in a tree of wires. A wire having a small delay in the tree may be provided with a via having at least one through-hole that is adjusted to provide a proper delay, thereby balancing delays in the tree.

The delay and skew of a binary-tree wiring structure are also adjustable according to the present invention. This will be explained below.

Figure 11A:
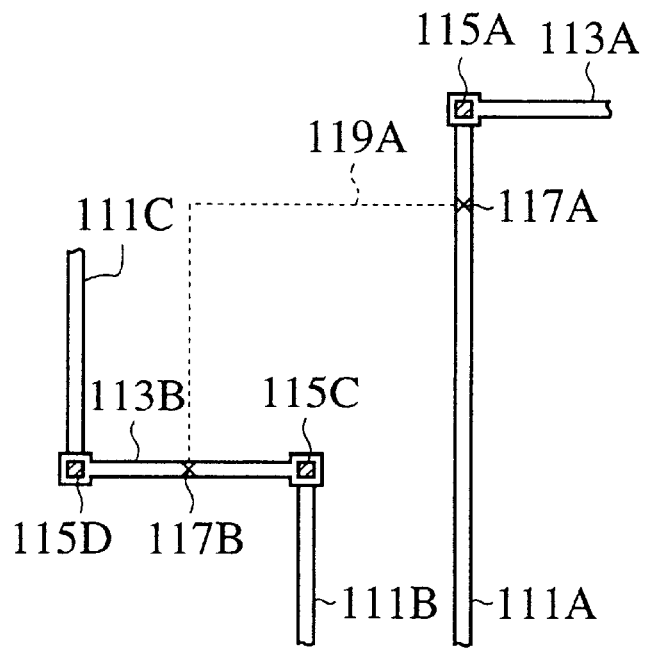
FIGS. 11A and 11B show a binary-tree wiring structure according to an embodiment of the present invention.
Figure 11B:
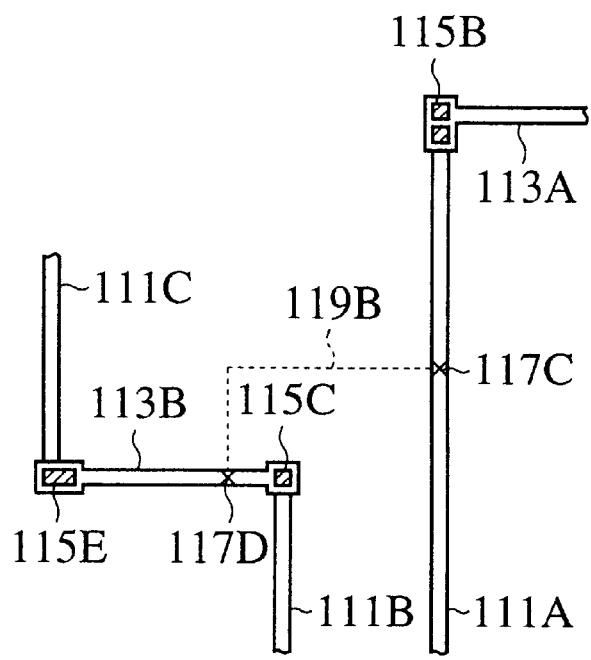

FIG. 11A shows a binary-tree wiring structure having a connection path 119A formed without optimizing the number and area of through-holes of vias. FIG. 11B shows a binary-tree wiring structure having a connection path 119B formed after optimizing the number and area of through-holes of vias.

In FIG. 11A, a wire segment 111A formed on a first layer is connected to a wire segment 113A formed on a second layer through a via having a standard through-hole 115A. Wire segments 111B, 113B, and 111C are connected to one another through vias having standard through-holes 115C and 115D. The paths 111A and 113A have a delay balance point 117A, and the paths 111B, 113B, and 111C have a delay balance point 117B. The delay balance points 117A and 117B are connected to each other through the connection path 119A, which is the shortest path.

In FIG. 11B, the paths 111A and 113A are connected to each other through a via having two through-holes 115B each having the same area as the through-hole 115A of FIG. 11A. In this case, the resistance $r_{115A}$ of the via having the through-hole 115A and the resistance $r_{115B}$ of the resistance of the via having the two through-holes 115B are as follows:

$$r_{115B} < r_{115A} \quad (9)$$

A delay D8 from the delay balance point 117A toward the wire 113A is as follows:

$$D8 = r_{115A-117A} \times (C_{113A} + C_{115A-117A}/2) + r_{115A} \times C_{113A} + D_{113A} \quad (10)$$

Due to the change of the via between the wire segments 111A and 113A, this delay becomes as follows:

$$D8' = r_{115A-117A} \times (C_{113A} + C_{115A-117A}/2) + r_{115B} \times C_{113A} + D_{113A} \quad (11)$$

where $r_{115A-117A}$ is the resistance of the wire segment 111A between the via having the through-hole 115A and the delay balance point 117A, $C_{113}A$ is the capacitance of the wire segment 113A, $C_{115A-117A}$ is the capacitance of the path 111A between the via having the through-hole 115A and the delay balance point 117A, and $D_{113A}$ is a delay in a lower course from the wire segment 113A.

According to the expression (9), the following is established:

$$D8' < D8 \quad (12)$$

Due to the change of the via, the point 117A is no longer a delay balance point, and a point 117C becomes a new delay balance point.

Due to the delay balance point 117C, the resistance $r_{115B-117C}$ and capacitance $C_{115B-117C}$ increase as follows:

$$r_{115B-117C} > r_{115A-117A} \quad (13)$$

$$C_{115B-117C} > C_{115A-117A} \quad (14)$$

A delay D8 from the delay balance point 117C toward the wire segment 113A in FIG. 11B is as follows:

$$D8 = r_{115B-117C} \times (C_{113A} + C_{115B-117C}/2) + r_{115B} \times C113A + D_{113A} \quad (15)$$

At the delay balance point 117C, the delay D8 balances with a delay from the point 117C toward the path 111A.

Similarly, the wire segments 111C and 113B are connected to each other through a through-hole 115E of FIG. 11B that is larger than the through-hole 115D of FIG. 11A. As a result, the delay balance point 117B of FIG. 11A is moved to a delay balance point 117D of FIG. 11B.

The new delay balance points 117C and 117D are connected to each other through a connection path 119B of FIG. 11B, which is shorter than the connection path 119A of FIG. 11A.

In this way, the present invention adjusts the number and area of through-holes of each via of a binary-tree wiring structure, thereby shortening a connection path that connects two wiring paths of the structure to each other, thereby reducing a delay in the connecting path. This technique is applicable to reduce a delay in a wiring tree that is formed from the bottom to top thereof. If a delay balance point is not found in a given wire, vias in the wire may be adjusted or created according to the present invention, to produce a delay balance point in the wire.

FIGS. 12A, 12B, 13A, and 13B show modifications of the embodiment of FIGS. 11A and 11B.

Figure 12A:
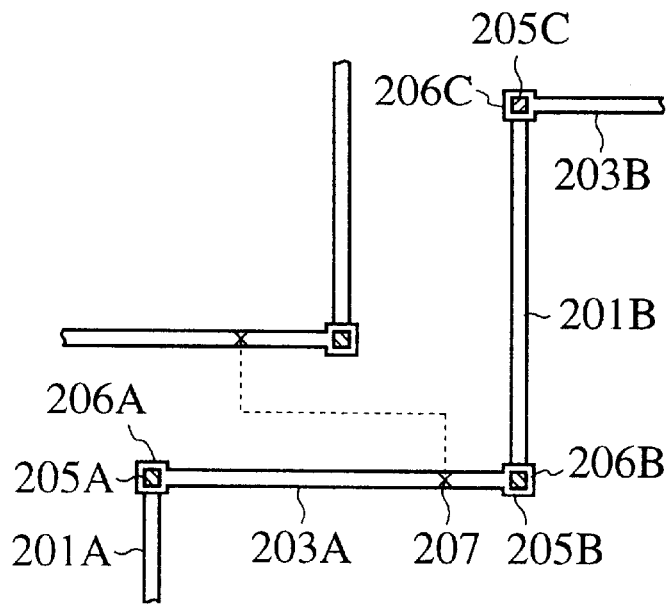
FIGS. 12A and 12B show a modification of the wiring structure of FIGS. 11A and 11B.
Figure 12B:
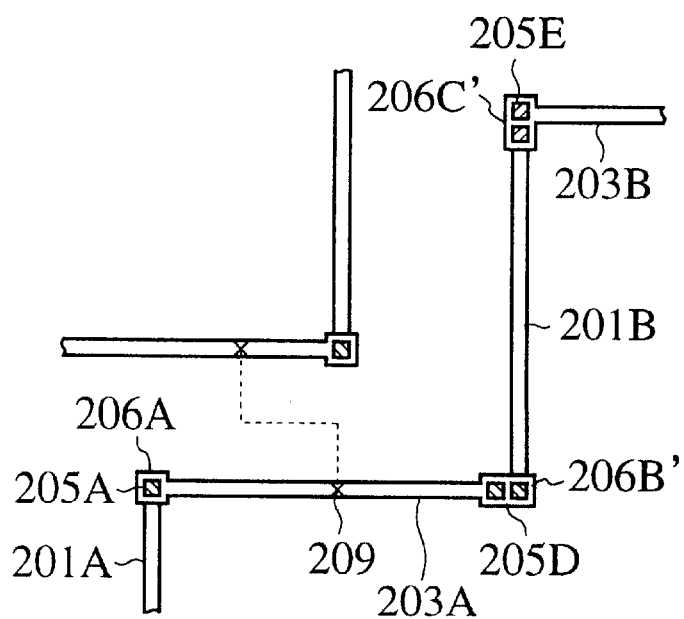

In FIG. 12A, wire segments 201A, 203A, 201B and 203B are connected to one another through vias 206A, 206B, and 206C having standard through-holes 205A, 205B, and 205C. This arrangement is changed into one shown in FIG. 12B in which the wire segments 203A and 201B are connected to each other through a via 206B' having two through-holes 205D each having the same area as any one of the through-holes 205A to 205C, and the wire segments 201B and 203B are connected to each other through a via 206C' having two through-holes 205E each having the same area as any one of the through-holes 205A to 205C. As a result, a delay balance point 207 of FIG. 12A is shifted to a delay balance point 209 of FIG. 12B.

Figure 13A:
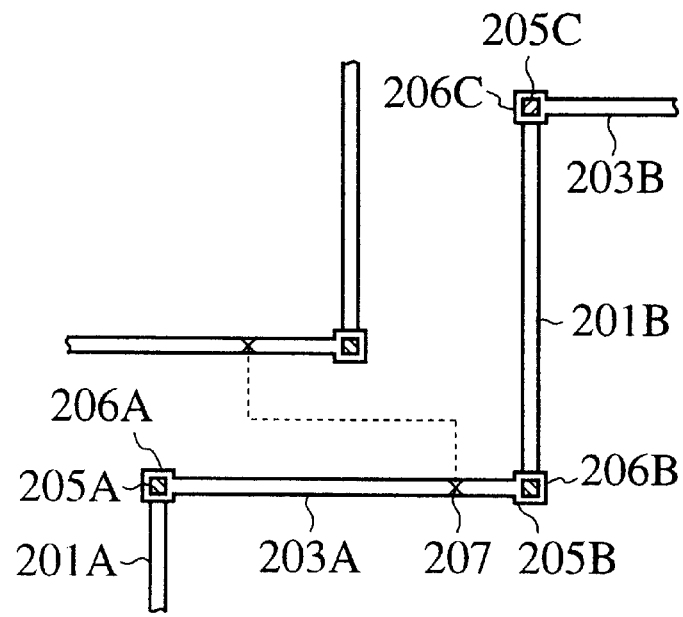
FIGS. 13A and 13B show a modification of the wiring structure of FIGS. 11A and 11B.
Figure 13B:
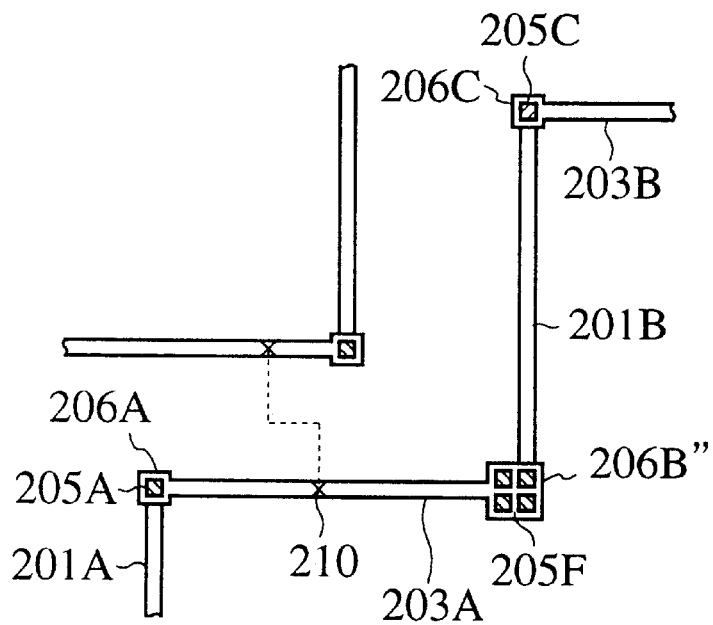

In FIG. 13A, wires 201A, 203A, 201B and 203B are connected to one another through vias 206A, 206B and 206C having standard through-holes 205A, 205B, and 205C. This arrangement is changed into one shown in FIG. 13B in which the wire segments 203A and 201B are connected to each other through a via 206B" having four through-holes 205F each having the same area as any one of the through-holes 205A to 205C. As a result, a delay balance point 207 of FIG. 13A is shifted to a delay balance point 210 of FIG. 13B.

It is possible to apply the present invention only to wires that must transmit signals having severe delay specifications, so that an increase in the number and area of through-holes of each via may not increase a wiring area.

In summary, the present invention reduces the resistance of a via by changing the number and area of through-holes of the via, thereby decreasing a delay in transmitting signals.

The present invention uses the resistance of vias in a wiring path, to adjust a delay in transmitting signals through the wiring path without largely changing the structure of the wiring path.

The present invention adjusts the number and area of through-holes of vias in a binary-tree wiring structure, to shorten a connection path that connects the delay balance points of wiring paths of the binary-tree structure to each other, thereby reducing a delay in the connection path.

What is claimed is:

1. A method of wiring devices formed on a semiconductor integrated circuit, comprising the steps of:

finding a wiring path between the devices;

determining whether or not a delay in transmitting signals through the wiring path is within a delay specification; and changing, if the delay is not within the delay specification, a through-hole area of a via in the wiring path so that the delay is within the delay specification.

2. The method of claim 1, comprising the step of:

increasing the through-hole area of the via.

3. The method of claim 2, comprising the step of:

forming a large through-hole in the via, thereby increasing the through-hole area of the via.

4. The method of claim 1, comprising the step of:

filling each through-hole of each via with different material from the material of the wiring.

5. A method of wiring delay balance points of given two wiring paths of a semiconductor integrated circuit, comprising the step of:

adjusting the through-hole areas of vias in the two wiring paths, to shift the delay balance points so that a connection path that connects the delay balance points to each other is shortened.

6. The method of claim 5, comprising the step of:

increasing the through-hole areas of the vias.

7. The method of claim 6, comprising the step of:

forming a large through-hole in a given via, thereby increasing the through-hole area of the via.

8. The method of claim 5, comprising the step of:

filling each through-hole of each via with different material from the material of the wiring.

9. The method of claim 5, further comprising the step of:

selecting a target via in the wiring paths if a delay in transmitting signals through the wiring is not in a specified range.

10. A method of wiring devices formed on a semiconductor substrate of a semiconductor integrated circuit, to provide a required operation, comprising the step of:

forming at least one new via to add a delay.

11. A method of wiring devices formed on a semiconductor integrated circuit comprising the steps of:

finding a wiring path between the devices;

determining whether or not a delay in transmitting signals through the wiring path is within a delay specification; and changing, if the delay is less than the delay specification, a through-hole area of a via in the wiring path so that the delay is increased to be within delay specification.

12. A method of wiring devices formed on a semiconductor integrated circuit, comprising the steps of:

finding a wiring path between the devices;

determining whether or not a delay in transmitting signals through the wiring path is within a delay specification; and changing, if the delay is not within the delay specification, a through-hole area of a via in the wiring path so that the delay is within the delay specification, wherein the through-hole area of the via is increased by forming a plurality of through-holes each having an identical area in the via.

13. A method of wiring devices formed on a semiconductor integrated circuit, comprising the steps of:

finding a wiring path between the devices;

determining whether or not a delay in transmitting signals through the wiring path is within a delay specification; and changing, if the delay is not within the delay specification, a through-hole area of a via in the wiring path so that the delay is within the delay specification;

wherein a target via among vias is selected in the wiring path whose delay is not within the delay specification.

14. A method of wiring delay balance points of given two wiring paths of a semiconductor integrated circuit, comprising the step of:

increasing the through-hole areas of vias in the two wiring paths, to shift the delay balance points so that a connection path that connects the delay balance points to each other is shortened, by forming a plurality of through-holes each having an identical area in a given via.

* * * * *